(12) United States Patent
Burghout et al.

(10) Patent No.: US 7,820,528 B2
(45) Date of Patent: Oct. 26, 2010

(54) METHOD OF FORMING A LEADED MOLDED ARRAY PACKAGE

(75) Inventors: William F. Burghout, Mesa, AZ (US); Francis J. Carney, Queen Creek, AZ (US); Joseph K. Fauty, Mesa, AZ (US); James P. Letterman, Mesa, AZ (US); Jay A. Yoder, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/535,475

(22) Filed: Aug. 4, 2009

(65) Prior Publication Data

US 2009/0298232 A1 Dec. 3, 2009

Related U.S. Application Data

(62) Division of application No. 11/259,981, filed on Oct. 28, 2005, now Pat. No. 7,588,999.

(51) Int. Cl.
*H01L 21/301* (2006.01)
*H01L 23/495* (2006.01)

(52) U.S. Cl. ..................................... 438/461; 257/676
(58) Field of Classification Search ................. 438/111, 438/123, 411, 461; 257/672, 676, E27.137, 257/E27.144
See application file for complete search history.

(56) References Cited

U.S. PATENT DOCUMENTS 7,588,999 B2 *  9/2009  Burghout et al. ............ 438/461
7,602,054 B2 * 10/2009  Letterman et al. ........... 257/678

* cited by examiner

*Primary Examiner*—Calvin Lee
(74) *Attorney, Agent, or Firm*—Kevin B. Jackson

(57) ABSTRACT

In one embodiment, a method for forming a leaded molded array package includes placing a lead frame assembly into a molding apparatus having lead cavities. The method further includes forming seals between conductive leads within the lead frame assembly and the lead cavities, and encapsulating the lead frame assembly to form a molded array assembly. The molded array assembly is then separated into individual leaded molded packages.

17 Claims, 8 Drawing Sheets

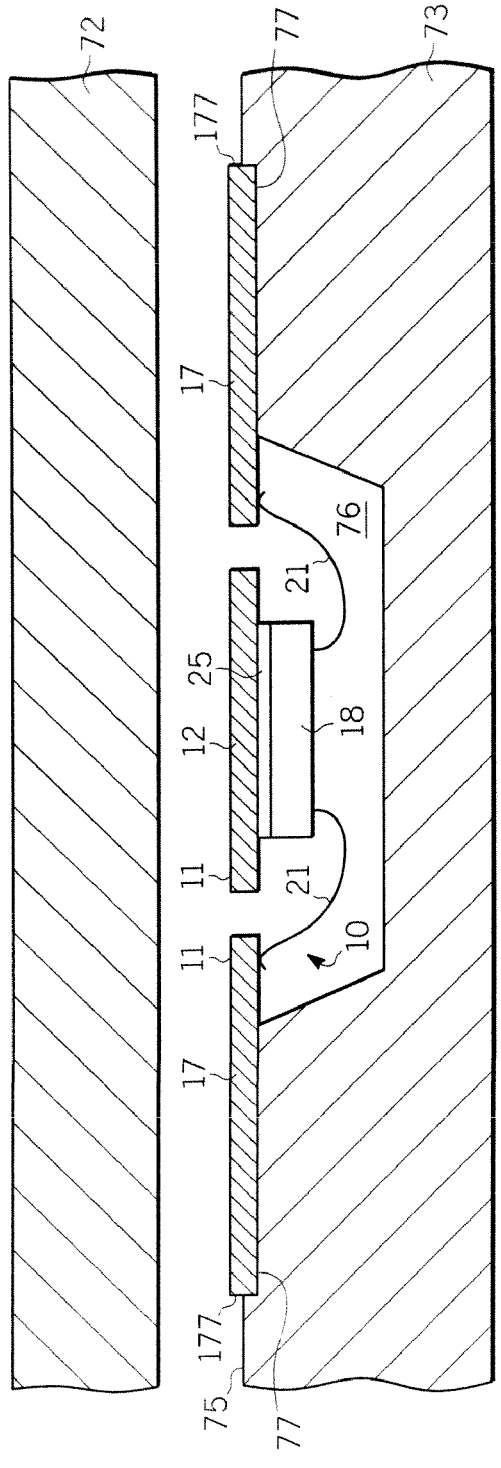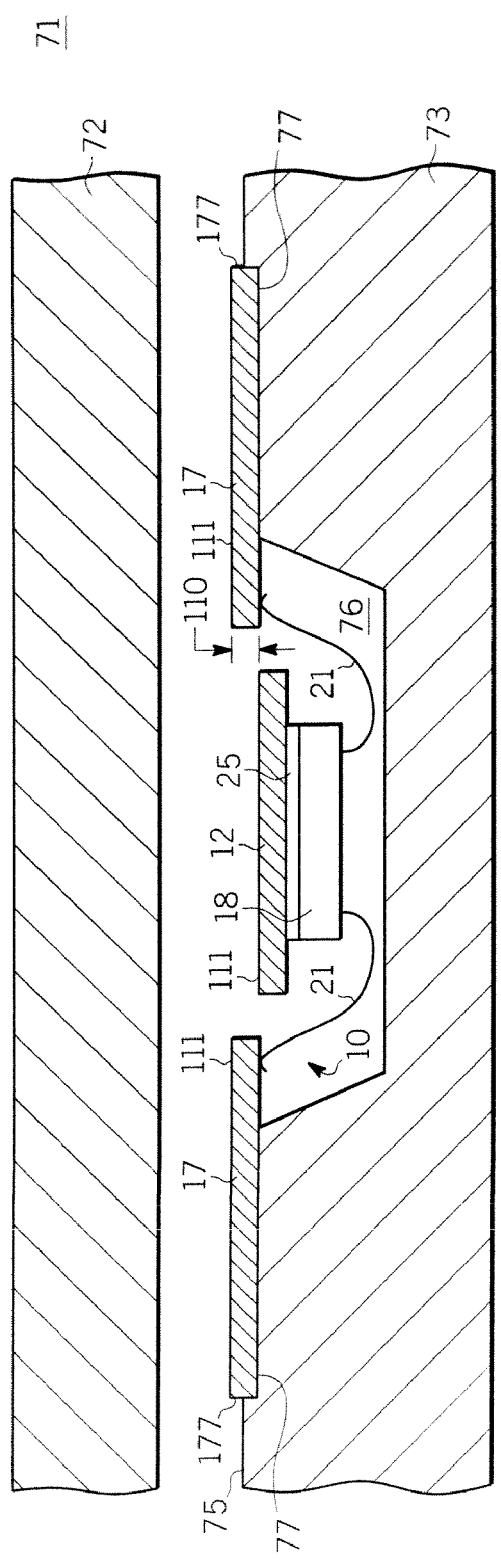

METHOD OF FORMING A LEADED MOLDED ARRAY PACKAGE

The present application is a divisional application of U.S. application Ser. No. 11/259,981 filed on Oct. 28, 2005, now U.S. Pat. No. 7,588,999.

FIELD OF THE INVENTION

This invention relates generally to electronic devices, and more specifically to semiconductor packages and methods of assembly.

BACKGROUND OF THE INVENTION

The handheld consumer products market is aggressive in the miniaturization of portable electronics. Driven at the present time by the cellular phone and digital assistant markets, manufacturers of these devices are challenged by ever shrinking formats and the demand for more PC-like functionality. This challenge asserts pressure on surface mount component manufacturers to design their products to command the smallest area possible. By doing so, this allows portable electronics designers to incorporate additional functions within a device without increasing the overall product size.

In Chip Scale Packaging (CSP) technologies, manufacturers strive to bring the package size as close as possible to the size of the semiconductor chip. The Quad Flat Pack No Lead (QFN) package is an example of a widely accepted and used low cost chip scale package. The QFN platform is cost effective because the platform uses highly automated assembly equipment and molded array package (MAP) encapsulation processes. However, because the QFN is leadless, manufacturers are unable to perform visual inspections of the connections after the QFN devices are attached to next levels of assembly such as printed circuit boards. This can result in end-products having reliability problems. Additionally, existing leaded CSP technologies such as the small outline IC (SOIC) platform are more expensive to manufacture than the QFN platform, and they are not compatible with MAP assembly techniques.

Accordingly, a need exists for a structure and method of manufacturing a leaded package that is cost effective and compatible with MAP assembly techniques.

BRIEF DESCRIPTION OF THE DRAWINGS

FIG. 7 illustrates a partial cross-section view of a manufacturing apparatus in accordance with the present invention for forming leaded molded array packages;

FIG. 11 illustrates a partial cross-sectional view of the manufacturing apparatus of FIG. 7 with an alternative lead frame assembly in accordance with the present invention;

DETAILED DESCRIPTION OF THE DRAWINGS

Figure 1:
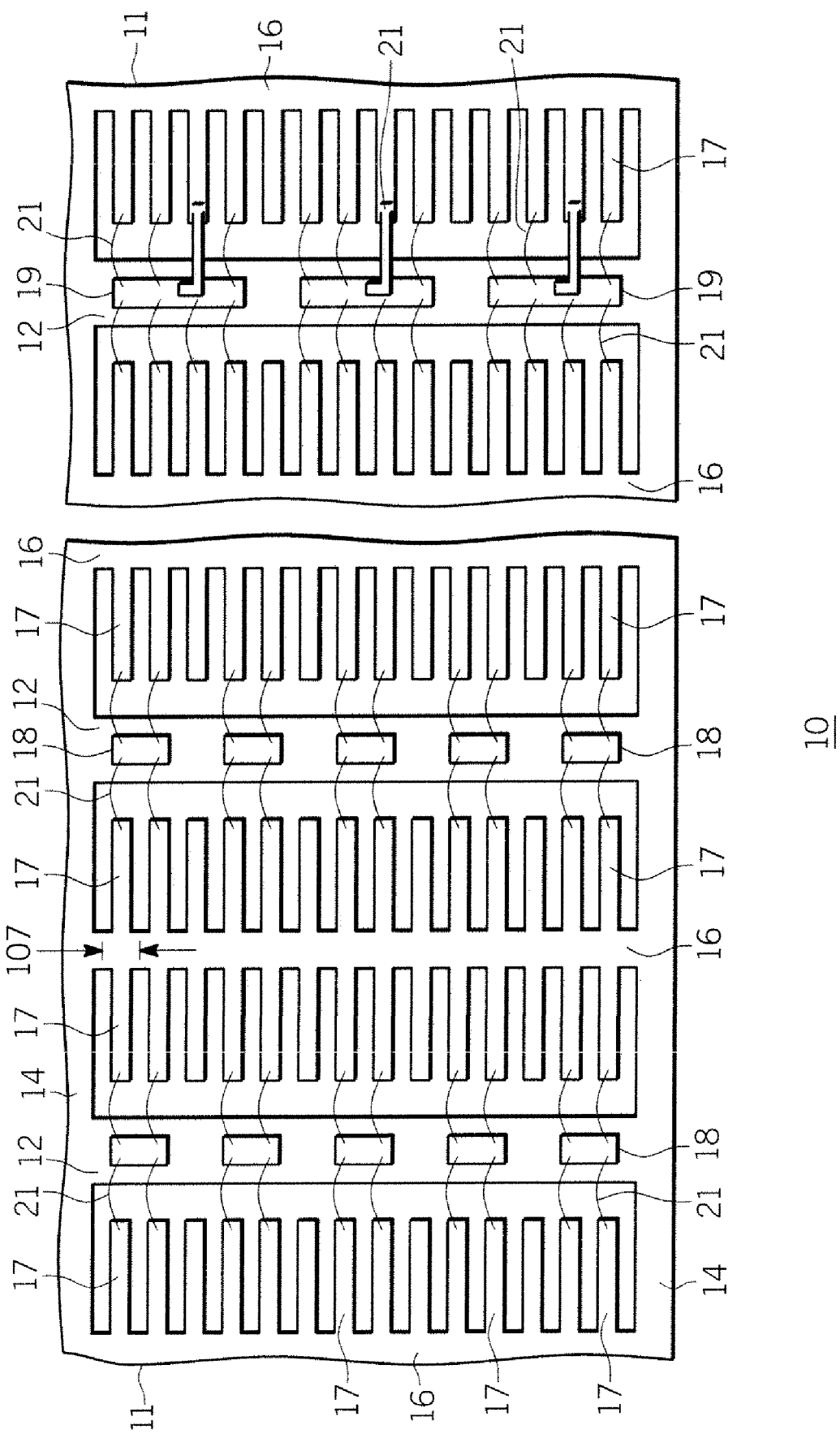
FIG. 1 illustrates a partial top view of a lead frame assembly in accordance with the present invention at an intermediate step in fabrication.

For ease of understanding, elements in the drawing figures are not necessarily drawn to scale, and like element numbers are used where appropriate throughout the various figures to denote the same or similar elements.

FIG. 1 shows a main lead frame assembly 10 in accordance with the present invention at an intermediate stage of manufacture. Lead frame assembly 10 includes a strip or array lead frame 11. In one embodiment, strip lead frame 11 is a substantially flat structure, and comprises a single gauge chemically milled or stamped sheet of a material such as a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such nickel-palladium and gold. Strip lead frame 11 is configured, for example, to be compatible with standard QFN packaging assembly tools.

Strip lead frame 11 further includes elongated flags or die attach paddles 12, which are integral with rails 14. In one embodiment, rails 14 run perpendicular to the ends of flags 12, which are spaced apart from each other and substantially parallel with each other. Lead support structures or bars 16 are formed or placed in between elongated flags 12, and include a plurality of conductive leads 17 placed in proximity to elongated flags 12. In one embodiment, conductive leads 17 and lead support bars 16 form a "comb-like" shape or structure with conductive leads 17 substantially perpendicular with respect to elongated flags 12.

Figure 5:
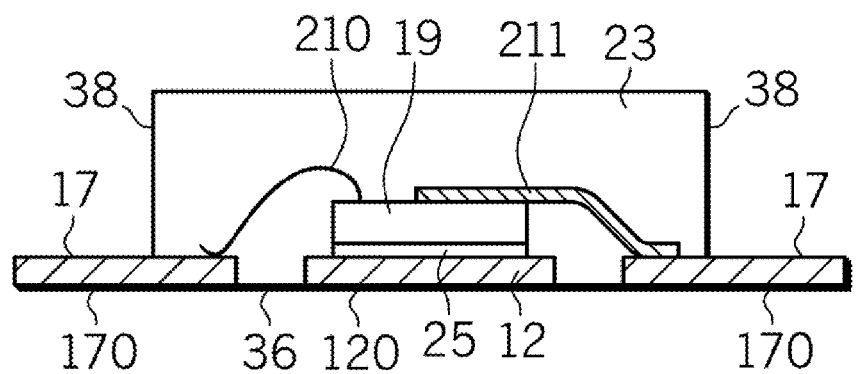
FIG. 5 illustrates a cross-sectional side view of the semiconductor package of FIG. 4.

In one embodiment (shown for example, in FIG. 5), conductive leads 17 and elongated flags 12 are not off-set with respect to each other, but are substantially co-planar or are as flat as practical. In another embodiment, they are offset with respect to each other, which is shown for example in FIGS. 6 and 11. In another embodiment, conductive leads 17 are rectangular in shape, but they may have other shapes compatible with selected printed circuit board or next level of assembly lay-outs. In a further embodiment, conductive leads 17 include bond posts, which provide increased surface area for connective structures.

Lead frame assembly 10 further includes a plurality of electronic chips 18 and 19, which are attached to elongated flags 12 using an attach layer 25 (shown in FIG. 5) such as a solder or a high conductivity epoxy material. By way of example, electronic chips 18 and 19 comprise power MOSFETS, bipolar power transistors, insulated gate bipolar transistors, thyristors, diodes, sensors, passive devise, optical devices, integrated circuits, logic devices, memory devices or combinations thereof. As shown in FIG. 1, elongated flags 12 provide for electronic chips having different sizes, which provides increased manufacturing flexibility and saves on costs because the same lead frame can be used to manufacture different types of devices. In one embodiment, the pitch 107 between conductive leads 17 is constant.

Connective structures 21 electrically connect electronic chips 18 and 19 to conductive leads 17. By way of example, connective structures 21 include connective wires 210 (shown in FIG. 5), wire bonds, conductive clips or straps 211 (shown in FIG. 5), or the like. When a clip or strap is used, a solder or conductive epoxy is suitable for attaching the clip or strap to lead 17 and electronic chips 18 and 19.

Figure 2:
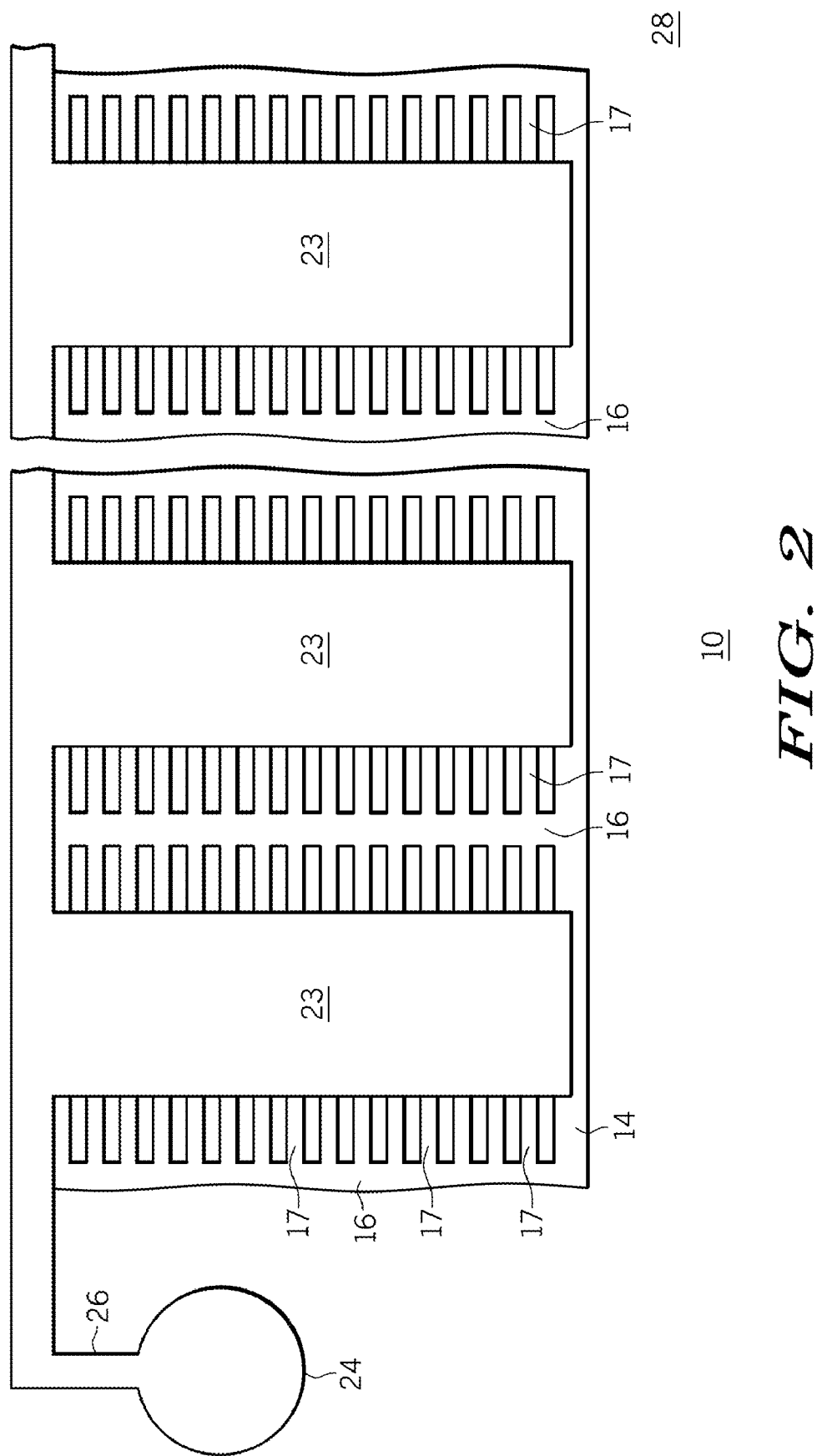
FIG. 2 illustrates a partial top view of the lead frame assembly of FIG. 1 after subsequent processing to form a molded array assembly.

FIG. 2 shows a top view of main lead frame assembly 10 after portions of the structure are encapsulated with a plastic encapsulating layer 23. In the example shown, a strip molded array process is used where encapsulating layer 23 is formed over elongated flags 12, connective structures 21, electronic chips 18 and 19, and portions of conductive leads 17 in proximity to elongated flags 12. By way of example, assembly structure 10 is placed in a molding apparatus such as a transfer molding device. A sold resin pellet is placed in cull or pot 24. When pot 24 is heated to melt the solid resin pellet, the liquefied resin material is forced from pot 24 through runners 26 into the slot mold cavities to form a continuous encapsulating layer or encapsulating layer 23, while leaving portions of leads 17 and lead support bars 16 exposed or un-encapsulated to form a molded array assembly 28.

Figure 3:
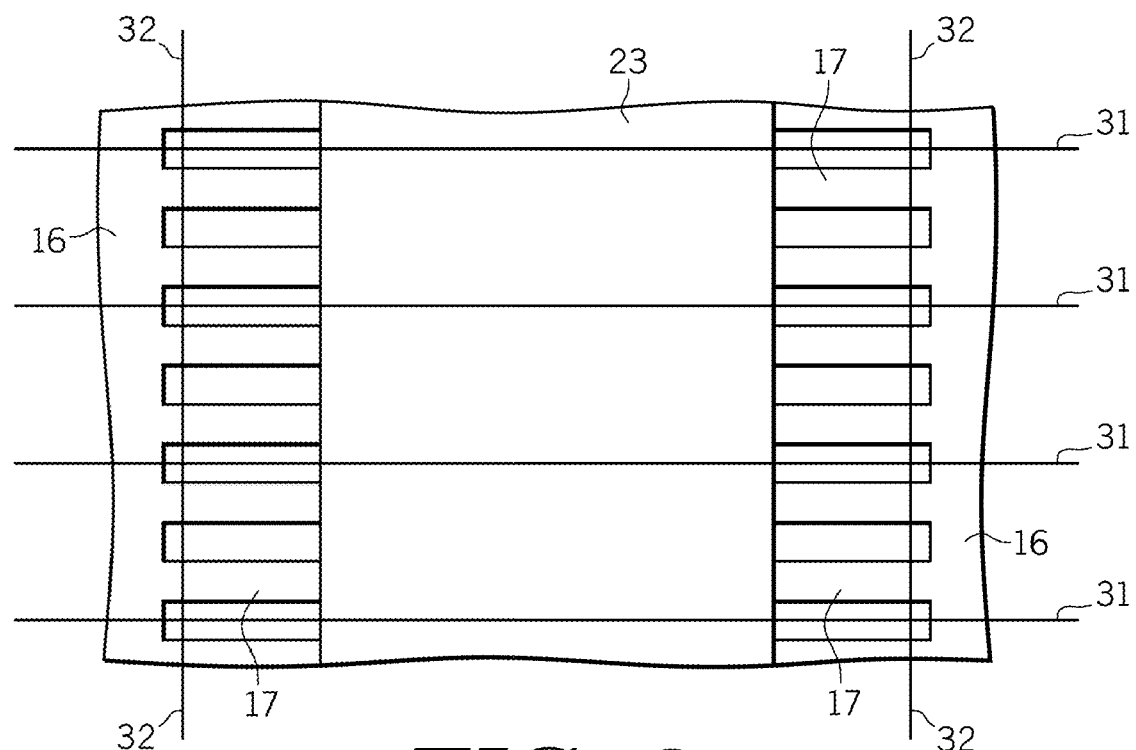
FIG. 3 illustrates a partial top view of a portion of the molded array assembly of FIG. 2 after further processing.

FIG. 3 shows a top view of a portion of molded array assembly 28 during a next step in fabrication. In this step, individual components are singulated or separated from molded array assembly 28 using saw cutting, laser cutting, or similar techniques. By way of example, singulation lines 31 are first or horizontal cut lines, where the singulation apparatus cuts through encapsulating layer 23 and elongated flags 12. Singulations lines 32 are second or vertical cut lines, where the singluation apparatus cuts through conductive leads 17 and rails 14.

Figure 4:
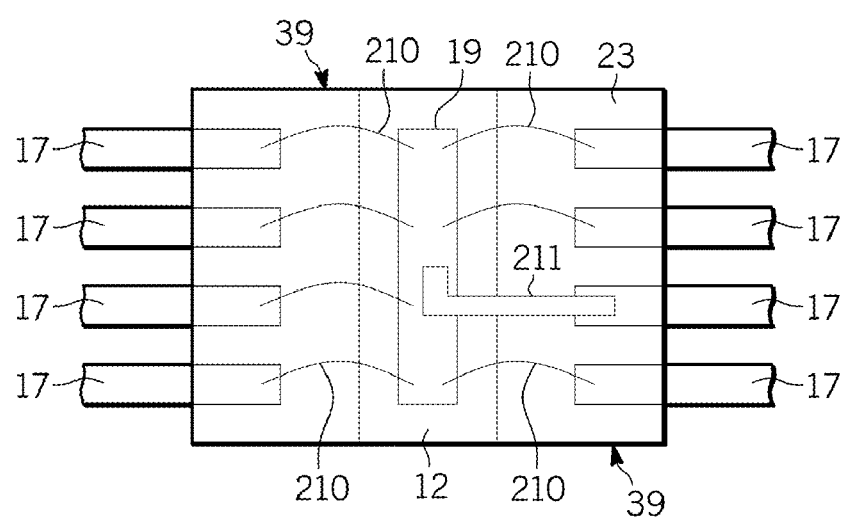
FIG. 4 illustrates a top view of a semiconductor package in accordance with the present invention.

FIG. 4 shows a top view of a semiconductor package 34 having exposed or outwardly extending conductive leads 17 in accordance with the present invention. In one embodiment, conductive leads 17 extend outwardly from the encapsulated portion 23 from a lower surface 36 of package 34 as shown in the side cross-sectional view of package 34 in FIG. 5. In accordance with the present invention, package 36 includes molded sides 38, which correspond to the sides where conductive leads extend outwardly from and are formed with a molding structure during encapsulation. Package 34 further includes singulated or cut sides 39 (shown in FIG. 4) that are formed during the singulation, cutting or separation process. Lower surfaces 170 and 120 of conductive leads 17 and elongated flag 12 are exposed as shown for coupling or connecting to a next level of assembly.

Figure 6:
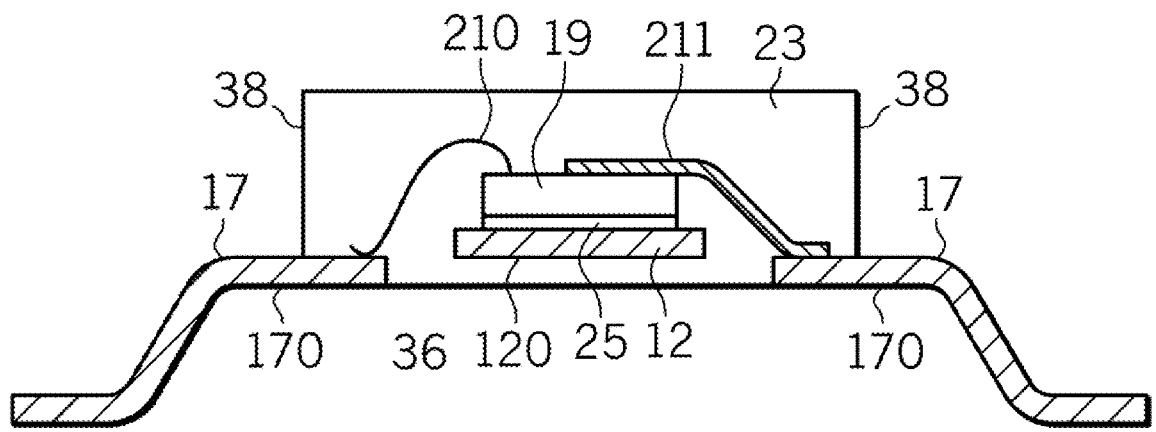
FIG. 6 illustrates a cross-sectional side view of another semiconductor package in accordance with the present invention.

FIG. 6 shows a side cross-sectional view of an alternative package 44 in accordance with the present invention. Package 44 is similar to package 34 except that elongated flag 12 is off-set with respect to conductive leads 17 so that encapsulating layer 23 covers lower surface 120 of elongated flag 12. Additionally, conductive leads 17 are shown after an optional lead shaping process that bends them into a desired shape such as a "gull-wing" shape as shown. Lower surfaces 170 of conductive leads 17 are exposed as shown in FIG. 6.

In accordance with the present invention, strip lead frame 11 is provided without, free of, or independent of epoxy mold dam-bars to avoid having to use expensive punch tools as part of the assembly process. However, a method and molding structure were needed to form packages 34 and 44 without forming encapsulating material or flash between conductive leads 17 during the encapsulating process. FIGS. 7-11 show a process and structure in accordance with the present invention for manufacturing leaded packages such as, but not limited to, packages 34 and 44 with dam-bar free lead frames.

FIG. 7 shows a cross-sectional and side view of a molding apparatus 71 for forming leaded molded array packages in accordance with the present invention. In one embodiment, apparatus 71 is used to slot mold or encapsulate lead frame assembly 10 as shown in FIG. 2. Apparatus 71 includes a top mold die 72 and a bottom mold die 73, which has a cavity 76. In this embodiment, lead frame assembly 10 is positioned in bottom mold die 73 such that a portion 177 of lead frame 11 extends above the upper surface or plane 75 of bottom mold die 73. As will be explained more fully below, this is accomplished using, for example, tapered, shaped or narrowed lead cavities. Additionally, in this embodiment, electronic chip 18 is placed in a die down configuration, which places electronic chip 18 and connective structures 21 within cavity 76.

Bottom mold die 73 further includes a plurality of semi-recessed lead cavities, channels or portions 77 for supporting conductive leads 17. In accordance with the present invention, channels 77 are narrowed, shaped or tapered so that portions 177 of conductive leads 77 initially extend above major surface 75. As a result, when top mold die 72 is brought into contact bottom mold die 73, the soft or pliable portions of leads 17 are crimped into lead cavities 77. This forms a seal that prevents the flow of encapsulating material 23 between conductive leads 17 during the molding process.

Figure 8:
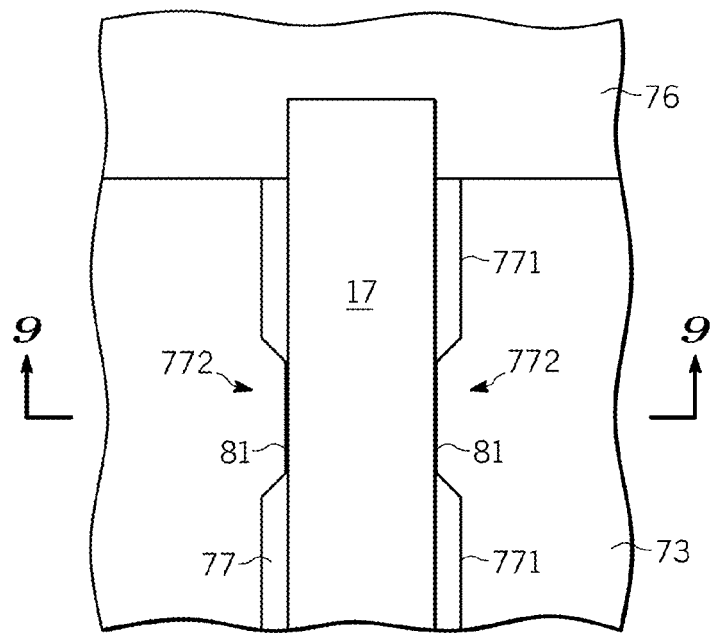
FIG. 8 illustrates a partial top view of a portion of the manufacturing apparatus of FIG. 7.

FIG. 8 is a top view of a portion of bottom mold die 73, which shows a lead cavity 77 and a conductive lead 17 placed within lead cavity 77. In accordance with the present invention, lead cavity 77 is tapered, narrowed or has a shape that forms a seal 81 with conductive lead 17 to prevent the flow of encapsulating material 23 between conductive leads 17. By way of example, lead cavity 77 is shown with tapered or narrowed portions 772 that have widths less than widths of conductive leads 17. Lead cavity 77 further includes, for example, widened portions 771, which are wider than conductive leads 17 as shown.

Figure 9:
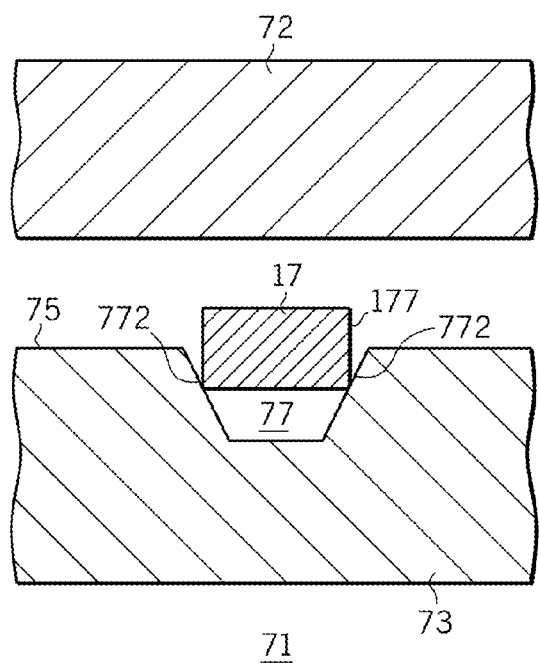
FIG. 9 illustrates a partial cross-sectional end view of a portion of the manufacturing apparatus of FIG. 7 taken along reference line 9-9 in FIG. 8.

FIG. 9 is a partial cross-sectional end view of apparatus 71 taken along reference line 9-9 of FIG. 8, which shows conductive lead 17 with portion 177 above major surface 75 of bottom mold die 73. FIG. 9 further shows lead cavity 77 with an example of a shape that has tapered portions 772 that subsequently forms a seal 81 with a conductive lead 17.

Figure 10:
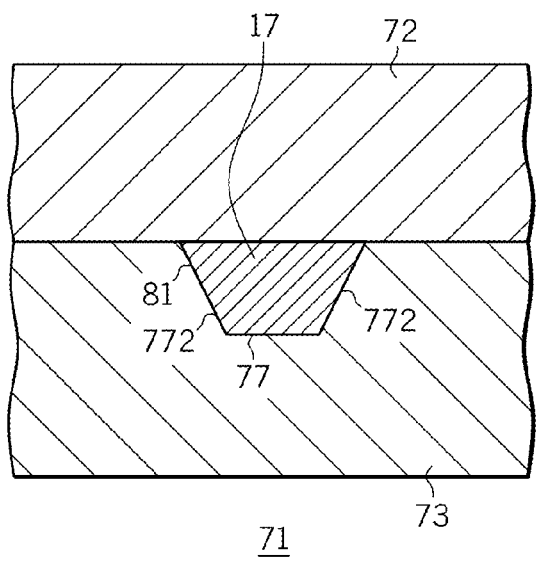
FIG. 10 illustrates a partial cross-sectional end view of a portion of the manufacturing apparatus of FIG. 9 at a subsequent step.

FIG. 10 shows apparatus 71 from the view of FIG. 9 after top mold die 72 is placed in contact with bottom mold die 73, which crimps portions of conductive leads 17 into lead cavities 77 to form seals 81. That is, molding apparatus 71 is closed thereby forcing conductive leads 17 into lead cavities 77 to form seals 81 between conductive leads 17 and lead cavities 77. This is achieved for example, by choosing a soft material for conductive leads 17. In other words, conductive leads 17 comprise a material having a hardness less than that of top mold die 72 and bottom mold die 73. In accordance with the present invention, this acts to prevent the flow of encapsulating material between conductive leads 17 and eliminates the need for epoxy mold dam-bars on lead frame 11. This saves on material costs and eliminates the need for using expensive punch tools to remove the dam-bars after molding.

FIG. 11 is a cross-sectional view of apparatus 71 with an alternative lead frame 111. Lead frame 111 is similar to lead frame 11 except that flags 12 are offset a distance 110 from conductive leads 17. Offset 110 provides, for example, package structure 44 shown in FIG. 6 where flag 12 is encapsulated or not exposed.

Figure 12:
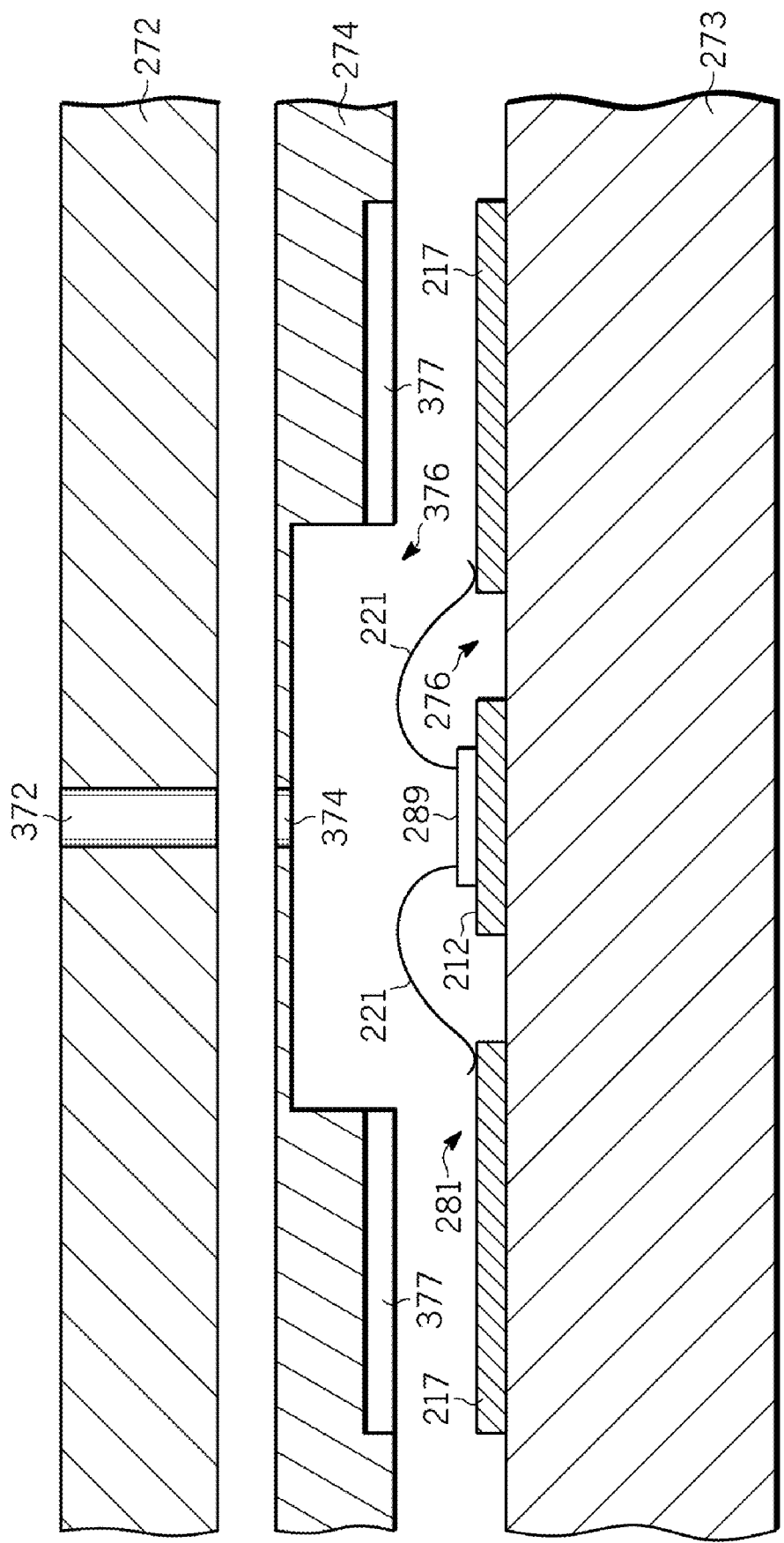
FIG. 12 illustrates a partial cross-sectional view of another manufacturing apparatus for forming molded packages in accordance with the present invention.

Turning now to FIGS. 12-15, a structure and method is described for forming single cavity molded packages with leads on more than two sides of the packages without using lead frames with epoxy mold dam-bars in accordance with present invention. FIG. 12 shows a cross-sectional view of a portion of a molding apparatus 271 that includes a top mold die 272, a bottom mold die 273, and a mold plate 274. In one embodiment, bottom mold die 273 has a single cavity 276 for holding a lead frame array 281. Lead frame array 281 includes a plurality of flags 212 for supporting electronic chips 289 and a plurality of conductive leads 217 in proximity to flags 212. Electronic chips 289 are electronically coupled to conductive leads 217 using connective structures 221 such as connective wires, clips, straps or the like.

Top mold die 272 is shown with an opening or aperture 372 for injecting a resin mold compound or molding material into apparatus 271. Mold plate 274 includes a cavity 376 that is shaped according to a desired outline or shape of the finished product. Mold plate 274 further includes an opening or aperture 374 for allowing the resin mold compound to flow into cavity 376. Mold plate 274 also includes a plurality of lead cavities, cut-outs, or channels 377, which are shaped, narrowed or tapered to form a seal or to crimp-off a portion of conductive leads 217 during the molding process.

Figure 13:
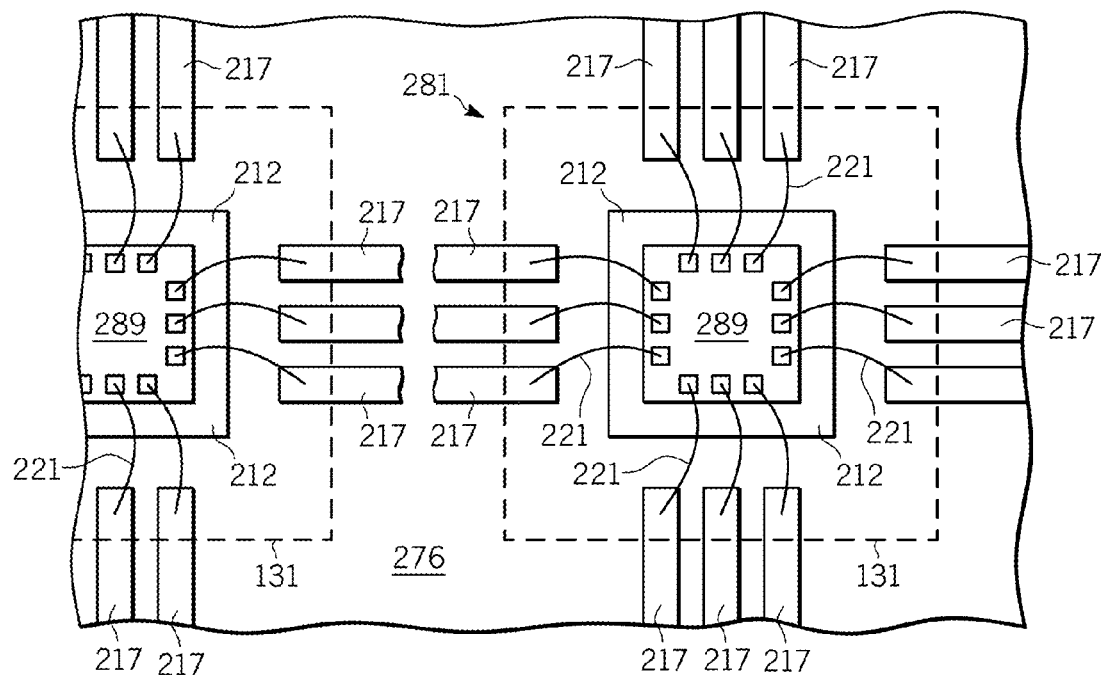
FIG. 13 illustrates a partial top view of a portion of the manufacturing apparatus of FIG. 12.

FIG. 13 shows a partial top view of cavity 276 formed in bottom mold die 273 for holding lead frame array 281 having a plurality of flags 212, a plurality of conductive leads 217, and a plurality of electronic chips 289 as described in conjunction with FIG. 12. Dashed lines 131 represents an example of an outline for an encapsulation layer or molded passivation layer corresponding to the shape of cavity 376 of mold plate 274.

Figure 14:
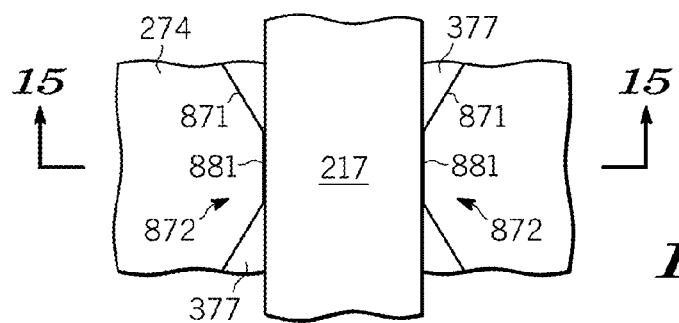
FIG. 14 illustrates a partial bottom view of a portion of the manufacturing apparatus of FIG. 12.

FIG. 14 is a partial bottom view of mold plate 274 showing a lead cavity 377 with a conductive lead 217 placed, sealed, or crimped therein. Lead cavity 377 has for example, tapered portions 872 that form a seal 881 with conductive lead 217 when contact is made between mold plate 274 and conductive leads 217. Conductive leads 217 comprise a soft material such as copper or the like or a material having a hardness less than the material that mold plate 274 comprises, and are crimped or forced into tapered portions 872 to form seals 881 between conductive leads 217 and lead cavities 377 as shown when molding apparatus 271 is closed.

Figure 15:
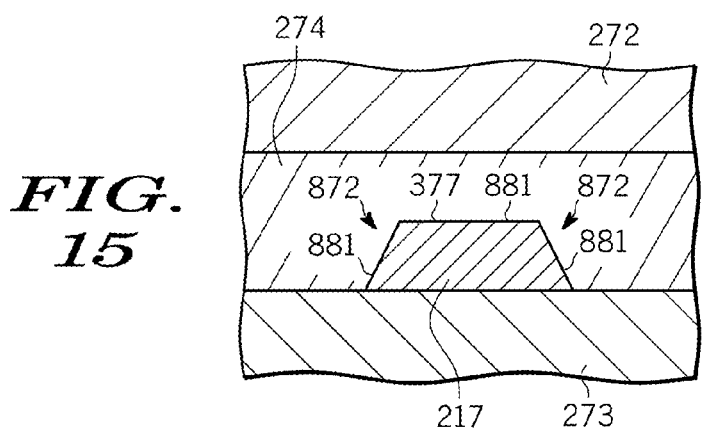
FIG. 15 illustrates a partial cross-sectional view of another portion of the manufacturing apparatus of FIG. 12.

FIG. 15 shows a partial cross-sectional view along reference line 15-15 in FIG. 14 with the addition of top mold die 272 and bottom mold die 273, and shows an example of conductive lead 217 crimped within lead cavity 377 to form seal 881. This prevents resin mold compound from flowing between conductive leads 217 and eliminates the need for epoxy mold dam-bars.

Thus, it is apparent that there has been provided, in accordance with the present invention, a structure and method for forming leaded molded array packages using lead frames independent of epoxy mold dam-bars. The method and structure provide leaded molded array packages that are cost effective and that provide manufacturers, among other things, with the desired ability to inspect bond integrity when the packages are attached to a next level of assembly.

Although the invention has been described and illustrated with reference to specific embodiments thereof, it is not intended that the invention be limited to these illustrative embodiments.

What is claimed is:

1. A method for forming leaded molded packages comprising the steps of:
   placing a lead frame assembly having conductive leads, flag portions with electronic chips attached thereto and electrically coupled to the conductive leads into a molding apparatus having a plurality of lead channels shaped to prevent flow of encapsulating material between adjacent conductive leads, wherein the lead frame assembly is free of dam-bars;
   crimping the conductive leads within the lead channels;
   molding portions of the lead frame assembly with an encapsulating layer while leaving portions of the conductive leads exposed to form a molded lead frame assembly; and
   singulating the molded lead frame assembly into individual leaded molded packages wherein the step of crimping includes the steps of:
   placing the conductive leads into the lead channels having tapered portions with widths less than widths of the conductive leads; and
   closing the molding apparatus to force the conductive leads into the tapered portions thereby forming seals between the conductive leads and the lead channels.

2. The method of claim 1, wherein the step of placing the lead frame assembly includes placing a lead frame assembly having electronic chips electrically coupled to the conductive leads with conductive straps.

3. The method of claim 1, wherein the step of placing the lead frame assembly includes placing a lead frame assembly having electronic chips electrically coupled to the conductive leads with conductive straps and wire bonds.

4. The method of claim 1, wherein the step of providing the lead frame assembly includes providing a lead frame assembly having conductive leads on all sides of at least one electronic chip.

5. The method of claim 1, wherein the step of singulating includes separating the molded lead frame assembly through portions of the encapsulating layer and the flag portions and separating through the conductive leads.

6. The method of claim 5, wherein the step of separating the molded lead frame assembly through portions of the encapsulating layer and the flag portions includes separating in a first direction, and wherein the step of separating through the conductive leads includes separating through the conductive leads in a second direction substantially perpendicular to the first direction.

7. The method of claim 1, wherein the step of providing the lead frame assembly includes providing the lead frame assembly, wherein the flag portions and the conductive leads are substantially co-planar.

8. The method of claim 1, wherein the step of providing the lead frame assembly includes providing the lead frame assembly wherein the flag portions are offset a distance from the conductive leads.

9. The method of claim 1, wherein the step of placing the lead frame assembly into the molding apparatus includes placing the lead frame assembly into a molding apparatus having a bottom mold die with a cavity and the plurality of lead channels, wherein the placing step further includes placing the lead frame assembly into the bottom mold die so that the electronic chips are within the cavity of the bottom mold die.

10. The method of claim 1, wherein the step of placing the lead frame assembly into the molding apparatus includes placing the lead frame assembly into a molding apparatus having a bottom mold die having a single bottom cavity and a mold plate having a mold cavity and the plurality of lead channels, and wherein the placing step further includes placing the lead frame assembly so that an electronic chip is within the mold cavity.

11. The method of claim 10, wherein the step of placing the lead frame assembly includes placing a lead frame assembly having conductive leads on all sides of the electronic chip.

12. The method of claim 1, further comprising the step of forming the conductive leads to provide a desired shape.

13. The method of claim 1, wherein the step of placing the lead frame assembly includes placing a lead frame assembly having electronic chips of different sizes.

14. The method of claim 1, wherein the step of molding includes molding portions of the lead frame assembly while leaving surfaces of the flag portions exposed through the encapsulating layer.

15. The method of claim 1, wherein the step of molding includes molding portions of the lead frame assembly so that the encapsulating layer covers surfaces of the flag portions opposite to the electronic chips.

16. The method of claim 1, wherein the step of placing the lead frame assembly includes placing a lead frame assembly having rails running substantially perpendicular to and integral with the flag portions.

17. The method of claim 16, wherein the step of placing the lead frame assembly includes placing a lead frame assembly having lead support structures including the conductive leads, and wherein the conductive leads are substantially perpendicular to the flag portions.

* * * * *